United States Patent [19]

Ogi et al.

[11] 4,126,204

[45] Nov. 21, 1978

[54] SPEAKER SYSTEM

[75] Inventors: Kenji Ogi; Masakatsu Sakamoto, both of Tokyo, Japan

[73] Assignee: Trio Kabushiki Kaisha, Tokyo, Japan

[21] Appl. No.: 764,220

[22] Filed: Jan. 31, 1977

[30] Foreign Application Priority Data

Feb. 2, 1976 [JP] Japan ............................ 51-10826[U]
Feb. 2, 1976 [JP] Japan ............................ 51-10827[U]

[51] Int. Cl.[2] ............................................. H05K 5/00
[52] U.S. Cl. ................................................. 181/156
[58] Field of Search ................................ 181/144–158, 181/166, 196, 197, 199; 179/1 E

[56] References Cited

U.S. PATENT DOCUMENTS

| | | | |
|---|---|---|---|
| 2,810,448 | 10/1957 | Van Diyck | 181/154 |
| 3,327,808 | 6/1967 | Shaper | 181/153 |
| 3,443,660 | 5/1969 | Virva et al. | 179/1 E |
| 3,684,051 | 8/1972 | Hopkins | 181/199 |

FOREIGN PATENT DOCUMENTS

| | | | |
|---|---|---|---|
| 104,979 | 8/1938 | Australia | 179/1 E |
| 61,871 | 2/1944 | Denmark | 181/148 |
| 1,065,126 | 12/1953 | France | 181/156 |
| 423,291 | 7/1947 | Italy | 181/156 |
| 696,671 | 9/1953 | United Kingdom | 181/156 |

*Primary Examiner*—Stephen J. Tomsky
*Attorney, Agent, or Firm*—Gerald J. Ferguson, Jr.; Joseph J. Baker

[57] ABSTRACT

In a bass-reflex type speaker system, in which sound signal waves radiating from the back of a speaker within a cabinet are emitted out through a hollow duct while the phase of the sound signal wave is reversed, the improvement comprising at least one dividing plate secured within the hollow duct and disposed parallel to the longitudinal direction of the duct or a hollow pipe with a diameter smaller than that of the duct, the hollow pipe being coaxially disposed within the hollow duct where the pipe may be made of sound absorbing material.

3 Claims, 12 Drawing Figures

SPEAKER SYSTEM

CROSS-REFERENCE TO RELATED APPLICATIONS

This application is related to U.S. application Ser. No. 758,757, filed Jan. 12, 1977 by Kenji Ogi, et al. and entitled "Loudspeaker System" and U.S. application Ser. No. 778,997, filed Mar. 18, 1977 by Akio Tanase and entitled "Speaker System".

BACKGROUND OF THE INVENTION

1. Field of the Invention

This invention relates to improved bass-reflex type speaker systems.

2. Discussion of the Prior Art

As shown in the prior art embodiments of FIGS. 1 and 2, sound signal waves radiating from the back of speakers 3 within a cabinet 1 are emitted out through a cylindrical duct 2 while the phase of the sound signal waves is reversed. In such conventional bass-reflex type speaker systems, there are produced in duct 2 standing waves which make mid-range sounds unclear or cause peaks and dips to appear in the frequency characteristic.

SUMMARY OF THE INVENTION

It is an object of this invention to eliminate the above mentioned defects and prevent the occurrence of standing waves without reducing the bass-reflex effect.

Other objects and advantages of this invention will become apparent after a reading of the specification and claims taken with the drawing.

DETAILED DESCRIPTION OF THE PREFERRED EMBODIMENT OF THE INVENTION

Figure 1A:
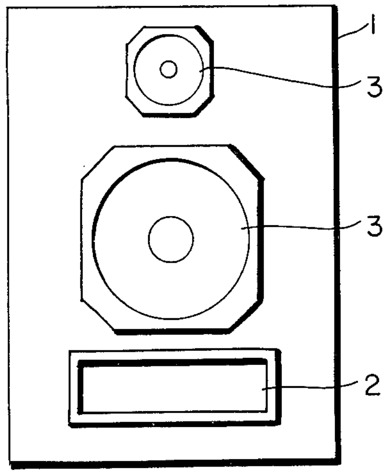
FIGS. 1 and 2 illustrate conventional bass-reflex type speaker systems where FIGS. 1(*a*) and 2(*a*) are front views and FIGS. 1(*b*) and 2(*b*) are sectional side views.
Figure 1B:
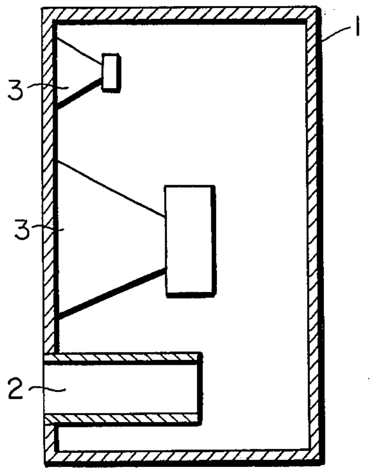
Figure 3:
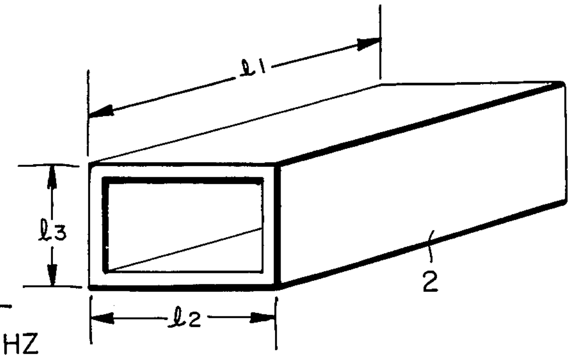
FIG. 3 is a perspective view of a conventional rectangular duct unit.

Hereinafter the invention will be described by referring to the embodiments thereof shown in the drawing. The frequencies of the standing waves in hollow rectangular duct 2 of FIG. 1 are related to the dimensions of duct 2 indicated in FIG. 3 and are given by the following equations.

$$f_1 = c/2l_1,\ f_2 = c/2l_2,\ f_3 = c/2l_3$$

where $l_1$: length (m.) of the duct;

$l_2$: width (m.) of the duct;

$l_3$: height (m.) of the duct; and $c$: sound velocity (m/sec.) in air

Figure 4:
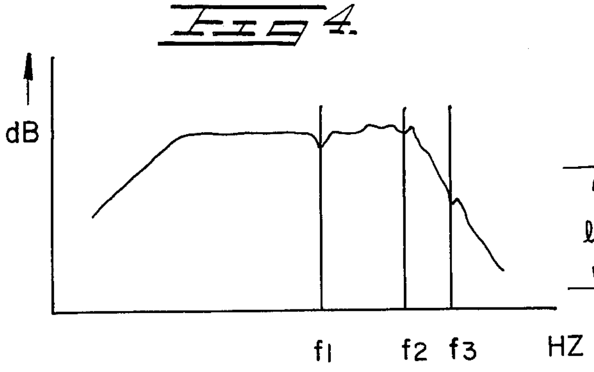
FIG. 4 is a frequency characteristic graph of a conventional bass-reflex type speaker system using the duct unit of FIG. 3.

As illustrated in FIG. 4, these standing waves of frequencies $f_1$, $f_2$ and $f_3$ generate peaks and dips at different frequencies in the frequency response curve.

According to the above equations, it is possible to remove the frequencies of the standing waves out of the reproducing frequency range of the woofer by shortening the length, width and height of the duct.

Figure 5A:
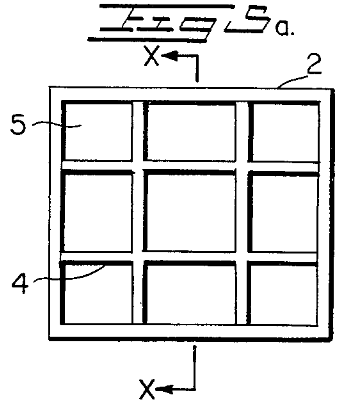
FIG. 5 is an illustrative duct unit of this invention, where FIG. 5(*a*) is a front view and FIG. 5(*b*) is a cross-sectional view taken along line X—X of FIG. 5(*a*).
Figure 5B:
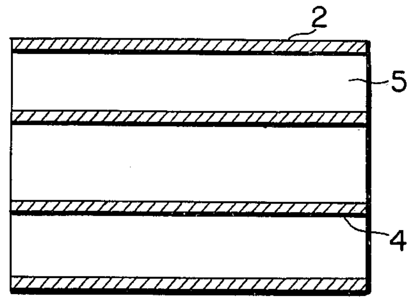

FIG. 5 illustrates a rectangular duct unit in accordance with an embodiment of this invention where FIG. 5(*a*) is a front view and FIG. 5(*b*) is a cross-sectional view taken along line X—X of FIG. 5(*a*). In FIG. 5, dividing plates 4 are arranged in a lattice-like manner and are longitudinally secured within the duct 2 to divide the duct into nine small spaces 5.

Constructed as above, the width $l_2$ and the height $l_3$ of duct 2 are divided by three. The frequencies of the $f_2$ and $f_3$ standing waves are higher than before and removed from the reproducing frequency range of the woofer. In this case, $l_1$ which relates to $f_1$ does not change; however, the fluctuation of pressure within small spaces 5 is smaller than when dividing plates 4 are not present so the undesired effect of the standing wave on the frequency characteristic is reduced.

Figure 2A:
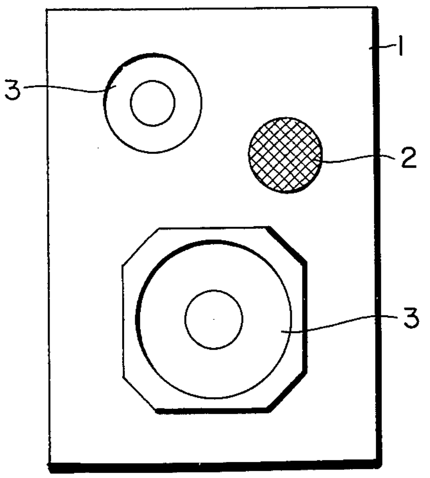
Figure 2B:
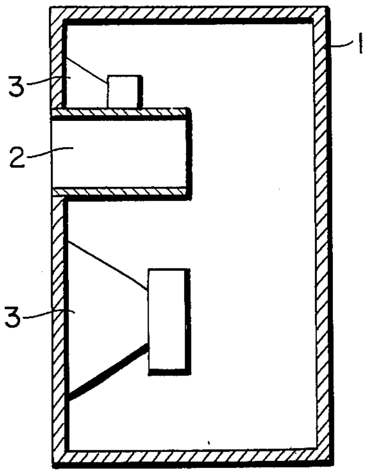
Figure 6A:
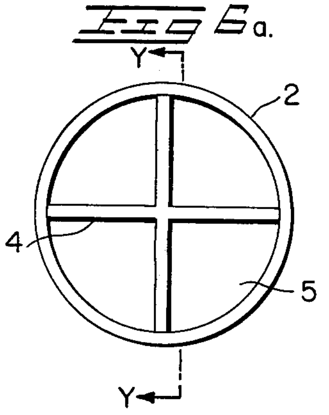
FIG. 6 is another illustrative duct unit of this invention where FIG. 6(*a*) is a front view and FIG. 6(*b*) is a cross-sectional view taken along line Y—Y of FIG. 6(*a*).
Figure 6B:
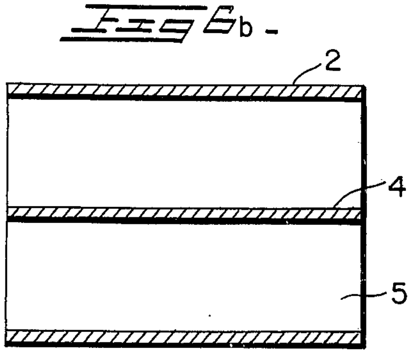

FIG. 6 illustrates a cylindrical duct unit corresponding to the one shown in FIG. 2, the duct being in accordance with another embodiment of this invention where FIG. 6(*a*) is a front view and FIG. 6(*b*) is a cross-sectional view taken along line Y—Y of FIG. 6(*a*). In this embodiment, dividing plates 4 longitudinally secured within duct 2 in a cross-like manner to divide the duct into four small spaces 5 are provided.

Different from the embodiment shown in FIG. 5, this embodiment mainly prevents the standing wave that occurs longitudinally within duct 2. The dividing plates 4 make the cross-section of the small spaces fan-shaped, which means no planes face each other, therefore it is difficult for the standing waves to occur. And, as is the case in the FIG. 5 embodiment, the fluctuation of pressure within small spaces 5 is smaller than when dividing plates 4 are not present.

Figure 7A:
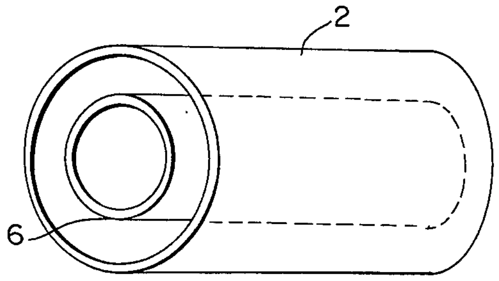
FIG. 7 is a further illustrative duct unit of this invention where FIG. 7(*a*) is a perspective view and FIG. 7(*b*) is a front view.
Figure 7B:
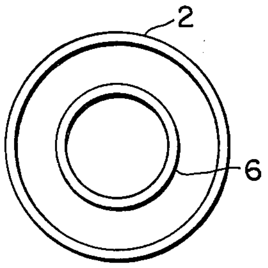

With respect to the FIG. 7 embodiment, the inventors have employed a standing wave prevention member in the form of a solid cylinder coaxially disposed within a cylindrical duct 2.

This is disclosed in U.S. patent application Ser. No. 758,757, filed Jan. 12, 1977. However, the solid cylinder changes the volume of the hollow duct, and thus the bass-reflex effect is undesirably affected.

FIG. 7 illustrates a duct unit 2 corresponding to the one shown in FIG. 2 where FIG. 7(*a*) is a perspective view and FIG. 7(*b*) is a front view. A hollow cylindrical pipe 6 is disposed coaxially within duct 2 and fixed thereto by appropriate means not shown in FIG. 7.

If duct unit 2 of FIG. 7 is employed in the speaker system of FIG. 2, the standing waves occur with difficulty because duct 2 is spatially divided.

The pipe 6 disposed within duct 2 can prevent standing waves even if it is made of non-sound absorbent material such as paper or synthetic resin. But if it is made of sound absorbent material such as urethane foam of low porosity, compressed acetate wool or felt-like materials, it can prevent the occurrence of standing waves more effectively to reduce the high frequency component leaked from the duct.

The speaker system of this invention, as described above, adds only dividing plates 4 or pipe 6 to conventional bass-reflex type speaker systems. Thus, it does not change the volume of the duct. Further, it can prevent standing waves and improve the frequency characteristic without reducing the bass-reflex effect. If pipe 6 disposed within duct 2 is made of sound absorbent material, the effect of preventing standing waves increases and the high frequency component leaked from the duct can be reduced whereby better sound reproduction can be obtained.

What is claimed is:

1. A base-reflex loudspeaker system comprising a cabinet, a loudspeaker opening in said cabinet, a loudspeaker mounted over said loudspeaker opening in said cabinet, a further opening in said cabinet, a first hollow duct mounted in said further opening and substantially extending into said cabinet, and a standing wave prevention member comprising a further hollow duct with a diameter smaller than that of said first hollow duct, said further hollow duct being substantially as long as said first hollow duct and being coaxially disposed and mounted therein, so that standing waves can be prevented from forming in said first hollow duct without introducing a high impedance to sound waves radiating therethrough.

2. A system as in claim 1 where said standing wave prevention member is made of a sound absorbent material.

3. A system as in claim 1 where said first and further hollow ducts are tubular.

* * * * *